(12) United States Patent
Thurgood

(10) Patent No.: US 12,451,463 B2
(45) Date of Patent: *Oct. 21, 2025

(54) SEMICONDUCTOR DEVICE ASSEMBLIES INCLUDING MULTIPLE STACKS OF DIFFERENT SEMICONDUCTOR DIES

(71) Applicant: Micron Technology, Inc., Boise, ID (US)

(72) Inventor: Blaine J. Thurgood, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/633,267

(22) Filed: Apr. 11, 2024

(65) Prior Publication Data

US 2024/0258273 A1 Aug. 1, 2024

Related U.S. Application Data

(63) Continuation of application No. 17/881,998, filed on Aug. 5, 2022, now Pat. No. 11,961,821, which is a
(Continued)

(51) Int. Cl.
*H01L 25/065* (2023.01)
*H01L 25/00* (2006.01)
(Continued)

(52) U.S. Cl.
CPC .......... *H01L 25/0652* (2013.01); *H01L 25/18* (2013.01); *H01L 25/50* (2013.01);
(Continued)

(58) Field of Classification Search
CPC ..... H01L 25/0652; H01L 25/18; H01L 25/50; H01L 24/73; H01L 2224/32145;
(Continued)

(56) References Cited

U.S. PATENT DOCUMENTS 8,456,856 B2 6/2013 Lin et al.
9,966,278 B1 5/2018 Kim et al.
(Continued)

FOREIGN PATENT DOCUMENTS

| JP | 2012186295 A | 9/2012 |
|---|---|---|
| TW | 200625597 A | 7/2006 |
| WO | 03017327 A2 | 2/2003 |

OTHER PUBLICATIONS

CN Patent Application No. 201880083503.6, Chinese Office Action mailed Jan. 20, 2023, with English Translation, 12 pages.
(Continued)

*Primary Examiner* — Thanh Y. Tran
(74) *Attorney, Agent, or Firm* — Dorsey & Whitney LLP

(57) ABSTRACT

A semiconductor device assembly is provided. The assembly comprises a package substrate, a first stack of semiconductor dies having a first set of planform dimensions disposed over a first location on the substrate, a second stack of semiconductor dies having a second set of planform dimensions different from the first set disposed over a second location on the substrate, and an encapsulant at least partially encapsulating the substrate, the first stack and the second stack. The first stack of semiconductor dies has a first planform area, the second stack of semiconductor dies has a second planform area, and a sum of the first and second planform areas can be at least 50%, 67%, 75%, or even more of an area of the package substrate.

20 Claims, 7 Drawing Sheets

Related U.S. Application Data continuation of application No. 17/011,093, filed on Sep. 3, 2020, now Pat. No. 11,410,969, which is a continuation of application No. 15/858,641, filed on Dec. 29, 2017, now Pat. No. 10,797,020.

(51) Int. Cl.
*H01L 25/18* (2023.01)
*G11C 5/04* (2006.01)
*H01L 23/00* (2006.01)

(52) U.S. Cl.
CPC ............... *G11C 5/04* (2013.01); *H01L 24/29* (2013.01); *H01L 24/32* (2013.01); *H01L 24/48* (2013.01); *H01L 24/49* (2013.01); *H01L 24/73* (2013.01); *H01L 2224/2919* (2013.01); *H01L 2224/32145* (2013.01); *H01L 2224/48145* (2013.01); *H01L 2224/48227* (2013.01); *H01L 2224/49175* (2013.01); *H01L 2224/73265* (2013.01); *H01L 2225/06506* (2013.01); *H01L 2225/0651* (2013.01); *H01L 2225/06541* (2013.01); *H01L 2225/06562* (2013.01); *H01L 2225/06565* (2013.01); *H01L 2924/00014* (2013.01); *H01L 2924/1434* (2013.01)

(58) Field of Classification Search
CPC . H01L 2224/48145; H01L 2224/49175; H01L 2924/1434; H01L 24/49
See application file for complete search history.

(56) References Cited

U.S. PATENT DOCUMENTS

| | | | |
|---|---|---|---|
| 10,797,020 B2* | 10/2020 | Thurgood | ............... H01L 25/18 |
| 11,410,969 B2* | 8/2022 | Thurgood | ............... H01L 25/50 |
| 11,961,821 B2* | 4/2024 | Thurgood | ............... H01L 25/18 |
| 2006/0267173 A1 | 11/2006 | Takiar et al. | |
| 2007/0218588 A1 | 9/2007 | Takiar et al. | |
| 2009/0160595 A1 | 6/2009 | Feng et al. | |
| 2012/0032244 A1 | 2/2012 | Hebert et al. | |
| 2012/0223441 A1 | 9/2012 | Omizo et al. | |
| 2014/0117430 A1 | 5/2014 | Lee et al. | |
| 2014/0367866 A1 | 12/2014 | Haba et al. | |
| 2015/0010269 A1 | 1/2015 | Jo et al. | |
| 2015/0091179 A1 | 4/2015 | Shenoy et al. | |
| 2015/0155218 A1 | 6/2015 | Hung et al. | |
| 2015/0200187 A1 | 7/2015 | Park et al. | |
| 2015/0340336 A1 | 11/2015 | Mohammed et al. | |
| 2016/0035698 A1 | 2/2016 | Lee et al. | |
| 2017/0125378 A1 | 5/2017 | Park et al. | |
| 2017/0373040 A1 | 12/2017 | Pagani | |
| 2018/0122771 A1 | 5/2018 | Park | |
| 2018/0158749 A1 | 6/2018 | Yu et al. | |
| 2019/0206835 A1 | 7/2019 | Thurgood | |
| 2020/0402953 A1 | 12/2020 | Thurgood | |
| 2022/0375897 A1 | 11/2022 | Thurgood | |

OTHER PUBLICATIONS

International Application No. PCT/US2018/060234—International Search Report and Written Opinion, mailed Mar. 13, 2019, 10 pages.
TW Patent Application No. 107141583—Taiwanese Office Action and Search Report, dated Oct. 3, 2019, with English Translation, 14 pages.

* cited by examiner

SEMICONDUCTOR DEVICE ASSEMBLIES INCLUDING MULTIPLE STACKS OF DIFFERENT SEMICONDUCTOR DIES

CROSS-REFERENCE TO RELATED APPLICATIONS

This application is a continuation of U.S. application Ser. No. 17/881,998, filed Aug. 5, 2022, which is a continuation of U.S. application Ser. No. 17/011,093, filed on Sep. 3, 2020, now U.S. Pat. No. 11,410,969; which is a continuation of U.S. application Ser. No. 15/858,641, filed Dec. 29, 2017, now U.S. Pat. No. 10,797,020; each of which is incorporated herein by reference in its entirety.

TECHNICAL FIELD

The present disclosure generally relates to semiconductor devices, and more particularly relates to semiconductor device assemblies including multiple stacks of different semiconductor dies.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include active circuits (e.g., providing functional features such as memory cells, processor circuits, and/or imager devices) and/or passive features (e.g., capacitors, resistors, etc.) as well as bond pads electrically connected to the circuits. The bond pads can be electrically connected to terminals outside the protective covering to allow the die to be connected to higher level circuitry.

To provide additional functionality, additional semiconductor dies can be added to a semiconductor device assembly. One approach to including additional semiconductor dies involves stacking the dies over the substrate. To facilitate the electrical connection of dies to the substrate, the dies can be arranged in a shingled stack, where each die is offset horizontally from a die below to leave exposed contact pads of the die that can be bonded (e.g., with a wirebond) to a corresponding bondfinger on the substrate. In this regard, FIG. 1 illustrates a semiconductor device assembly 100 in which a shingled stack 102 of dies 103 connected by adhesive layers is stacked on a substrate 101 and electrically connected to bondfingers 105 on the substrate 101 by wirebonds 106. The stack 102, substrate 101 and wirebonds 106 are encapsulated by, e.g., a mold material 105.

Semiconductor device assemblies are frequently provided in one of a number of widely-adopted physical formats for use in electronic devices. These formats may specify, e.g., the overall dimensions of the assemblies (i.e., width, length and height), the connectivity mechanisms (e.g., solder ball arrays, pads, pin outs, etc.), and other features of the assemblies. When a semiconductor die, or a stack thereof, have a planform area that utilizes most of the available space on a substrate that is required for a given format, as in FIG. 2, there is little wasted space in the package. As can be seen with reference to FIG. 2, a stack 202 of semiconductor dies 203 with a planform area that covers a majority (e.g., more than half, more than two-thirds, more than three-fourths, etc.) of the area of the substrate 201 leaves little wasted space in the assembly 200. As semiconductor dies continue to shrink due to process and technological advances, however, smaller dies may not make good use of the area available for a given assembly format.

For example, FIG. 3 illustrates a semiconductor device assembly in which a stack 302 of semiconductor dies 303 with a planform area that covers less than a majority (e.g., less than half, less than two-thirds, less than three-fourths, etc.) of the area of the substrate 301 leaves a great deal of wasted space in the assembly 300. To address this inefficiency, one approach involves using multiple stacks of smaller semiconductor dies, as shown in FIG. 4, but this approach can also be inefficient when the required format of a device assembly is not efficiently used even by multiple stacks of smaller semiconductor dies. As can be seen with reference to the semiconductor device assembly 400 illustrated in FIG. 4, even two stacks 402 and 412 of smaller semiconductor dies 403 may cover less than a majority (e.g., less than half, less than two-thirds, less than three-fourths, etc.) of the area of a substrate 401 for a given assembly format, leaving a great deal of wasted space in the assembly 400.

DETAILED DESCRIPTION

Figure 1:
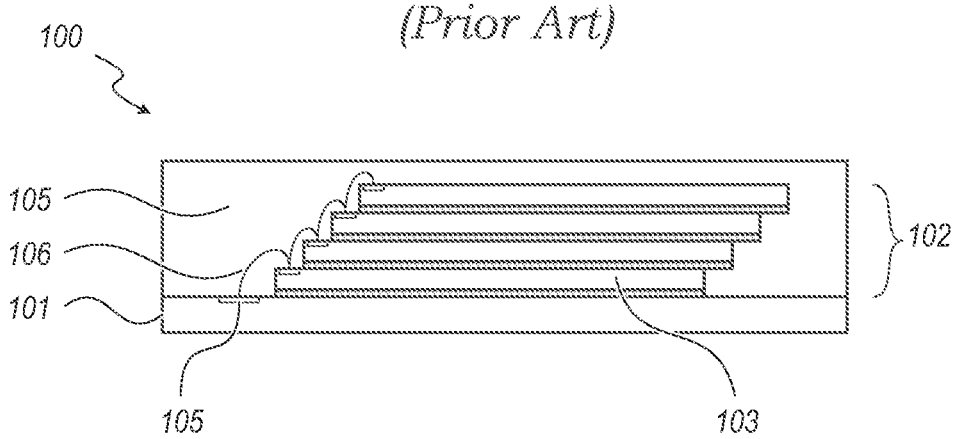
FIG. 1 illustrates a semiconductor device assembly including a stack of semiconductor dies.
Figure 2:
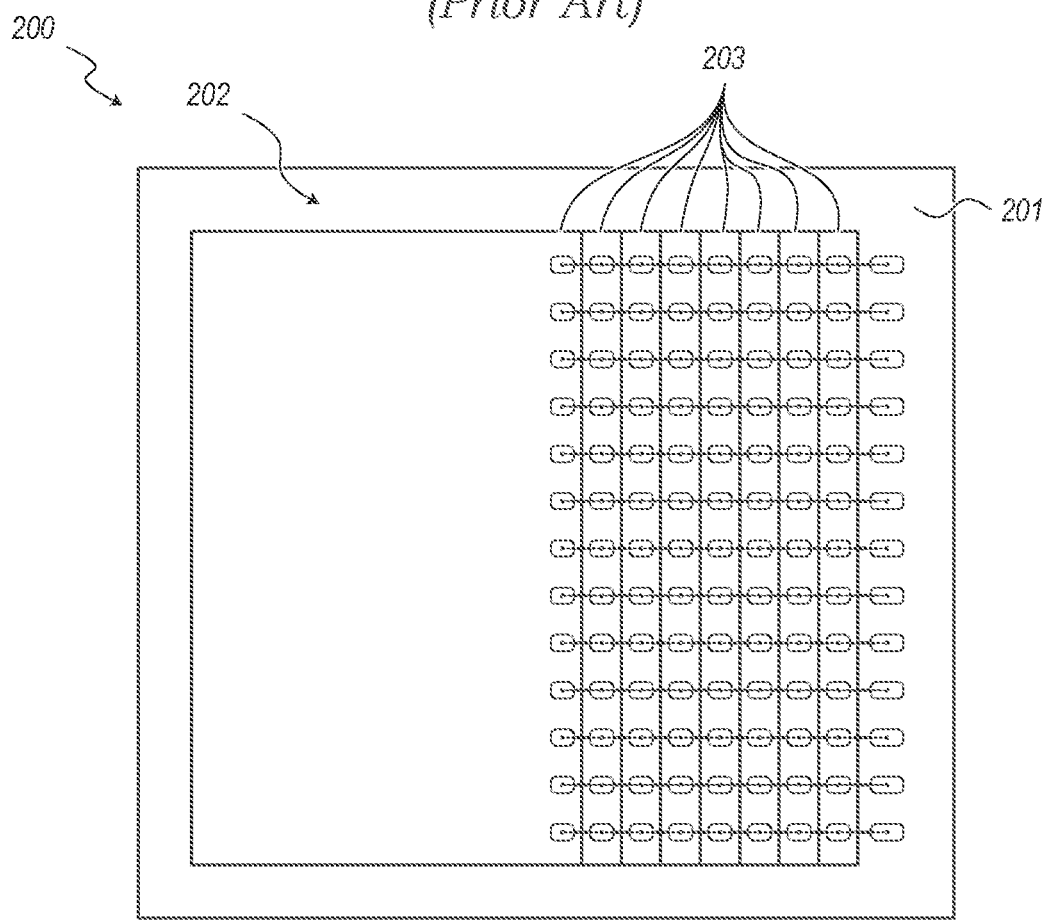
FIG. 2 illustrates a semiconductor device assembly including a stack of semiconductor dies.
Figure 3:
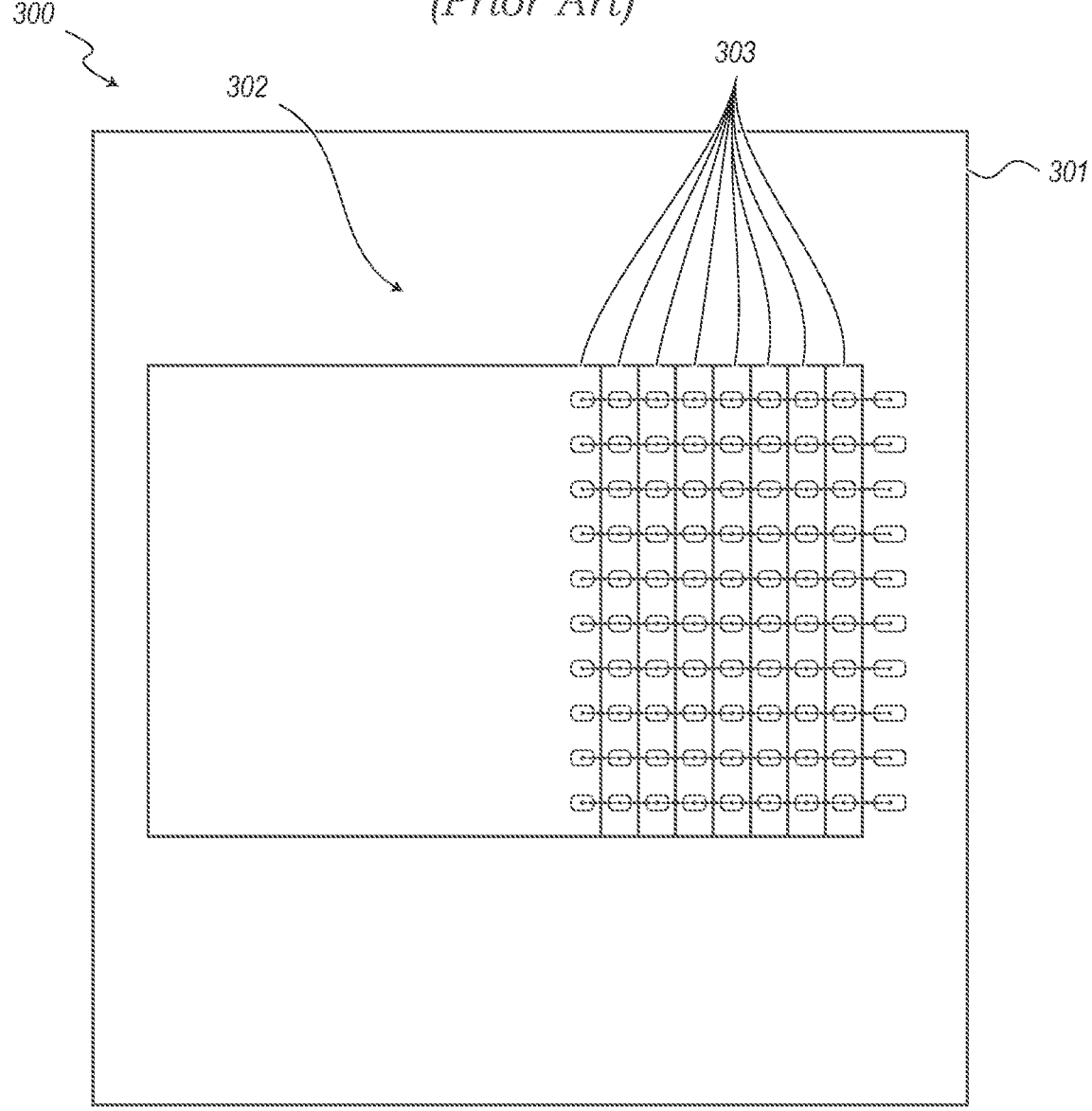
FIG. 3 illustrates a semiconductor device assembly including a stack of semiconductor dies.
Figure 4:
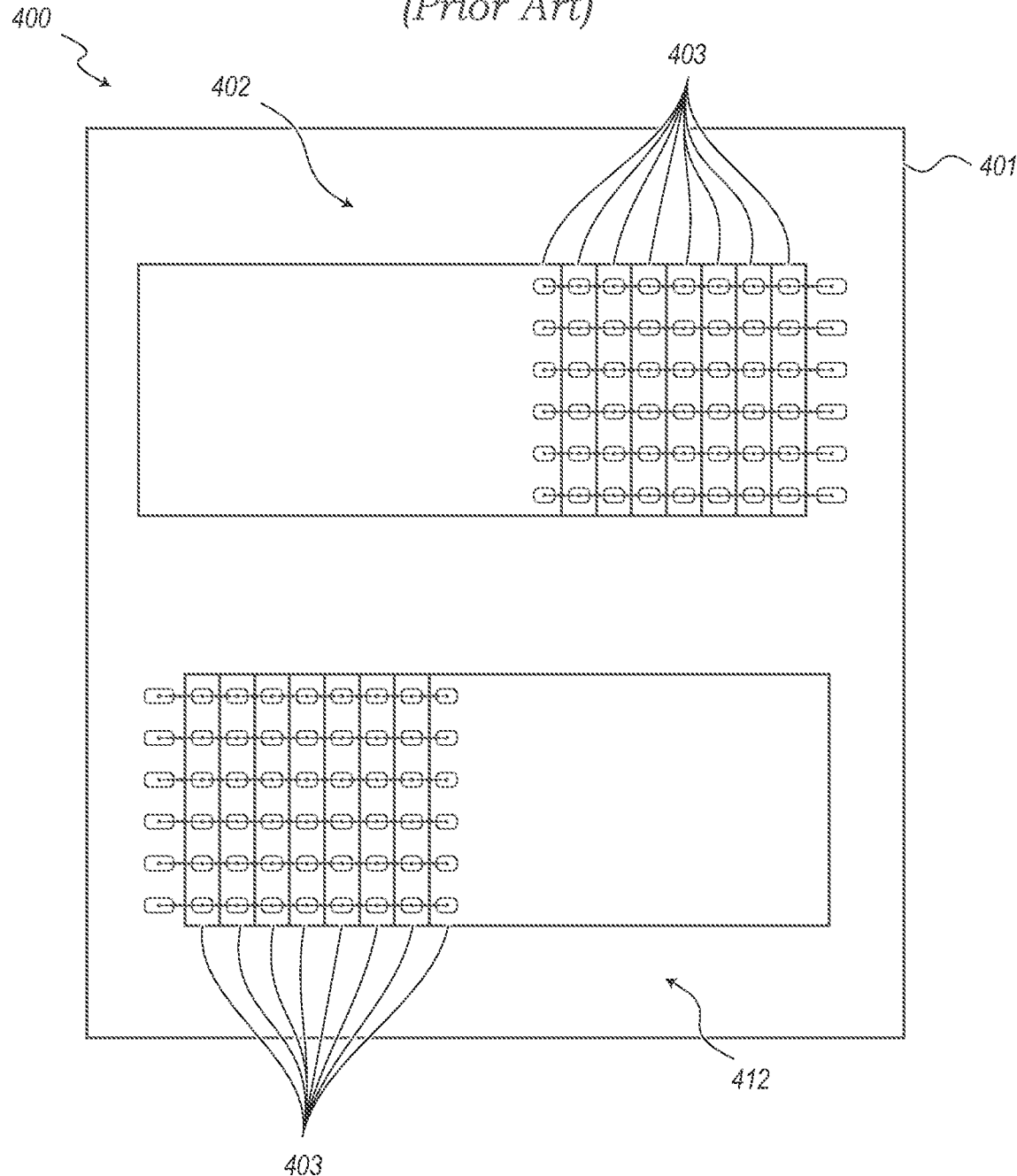
FIG. 4 illustrates a semiconductor device assembly including multiple stacks of semiconductor dies.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor device assemblies, such as semiconductor memory packages, may be provided in a number of different physical formats with predetermined sizes. When a semiconductor die is not sized to efficiently utilize the available space in a particular physical format, the inefficiency of unused space in the package can increase the relative cost of the assembly (e.g., as compared to an assembly in which a shorter stack of larger dies can provide the same memory capacity, or an equivalent stack of larger dies can provide greater memory capacity). Accordingly, it is desirable to provide more efficient use of available space in semiconductor device assemblies.

In this regard, several embodiments of the present technology are directed to semiconductor device assemblies that include a package substrate, a first stack of semiconductor dies having a first set of planform dimensions disposed over a first location on the substrate, a second stack of semiconductor dies having a second set of planform dimensions different from the first set disposed over a second location on the substrate, and an encapsulant at least partially encapsulating the substrate, the first stack and the second stack. The first stack of semiconductor dies has a first planform area, the second stack of semiconductor dies has a second planform area, and a sum of the first and second planform areas can be at least 50%, 67%, 75%, 90%, or even more of an area of the package substrate.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 5:
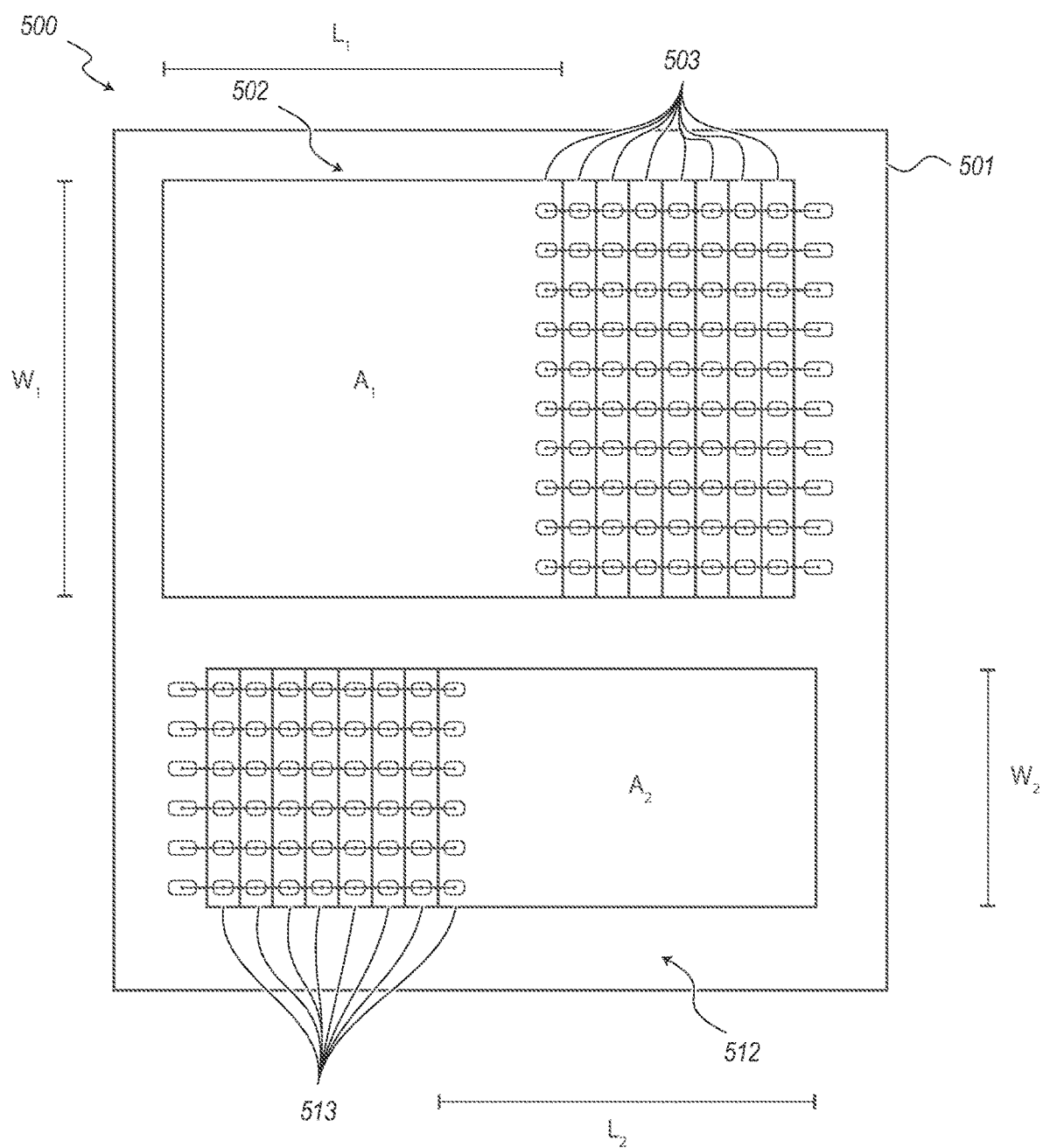
FIG. 5 illustrates a semiconductor device assembly including multiple stacks of different semiconductor dies in accordance with an embodiment of the present technology.

FIG. 5 is a simplified cross-sectional view of a semiconductor device assembly including multiple stacks of different semiconductor dies in accordance with an embodiment of the present technology. The semiconductor device assembly 500 includes a substrate 501, a first stack 502 of first semiconductor dies 503 and a second stack 512 of second semiconductor dies 513, which have a different set of planform dimensions (e.g., length and/or width) than the first semiconductor dies 503. In this regard, the first semiconductor dies 503 of the first stack 502 have a first length $L_1$ and a first width $W_1$, and the second semiconductor dies 513 of the second stack 512 have a second length $L_2$ and a second width $W_2$, where $L_1 \neq L_2$, and/or $W_1 \neq W_2$. By utilizing stacks of semiconductor dies with different sets of planform dimensions, the available space in a device assembly format of a predetermined size can be more efficiently exploited than with a single stack of semiconductor dies or with multiple stacks of semiconductor dies with the same dimensions. In this regard, the first stack 502 has a first area $A_1$, the second stack 512 has a second area $A_2$, and a sum of the first and second areas can be at least 50%, 67%, 75%, 90%, or even more of an area of the substrate 501.

In accordance with one aspect of the present technology, the semiconductor dies 503 and 513 of the first and second stacks 502 and 512 can be memory dies (e.g., NAND flash, NOR flash, DRAM, PCM, FeRAM, MRAM, etc.) and device assembly 500 can be a packaged memory device. The semiconductor dies 503 and 513 can be the same kind of memory (e.g., both NAND flash, both NOR flash, both DRAM, etc.) to provide increased memory capacity in device assembly 500 when compared to a device assembly with less-efficiently utilized physical space (e.g., due to the use of a single stack, or multiple stacks of the same dimensions).

Figure 6:
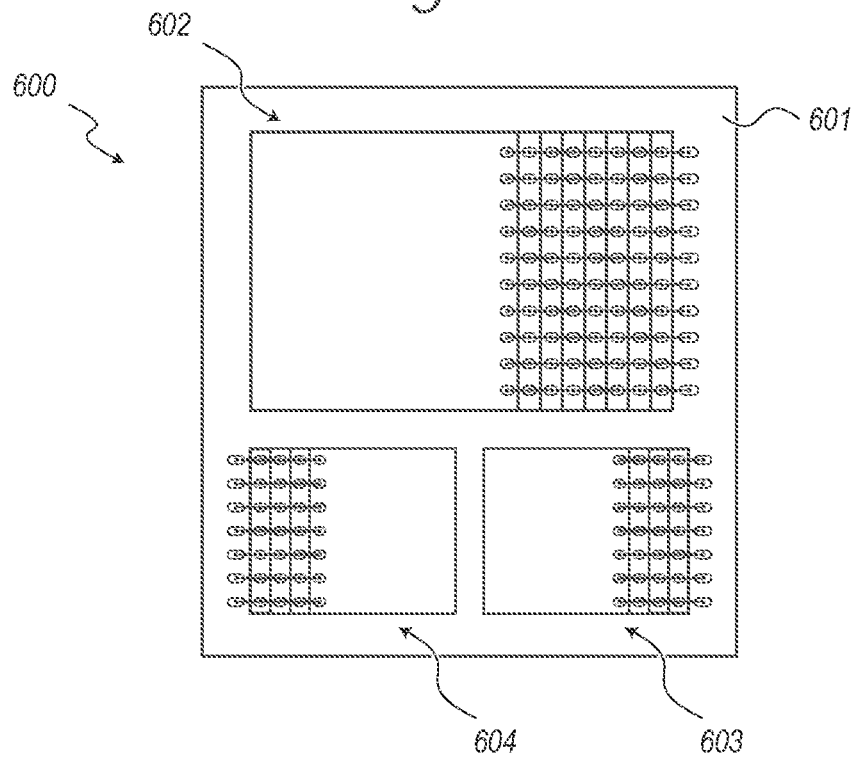
FIG. 6 illustrates a semiconductor device assembly including multiple stacks of different semiconductor dies in accordance with an embodiment of the present technology.

Although in the foregoing example embodiment, a semiconductor device assembly with two stacks of eight semiconductor dies has been illustrated, in other embodiments, the number of semiconductor dies in a stack, and the number of stacks in a device assembly, may vary. For example, FIG. 6 is a simplified plan view of a semiconductor device assembly including three stacks of two different semiconductor dies (e.g., semiconductor dies with two different sets of planform dimensions) in accordance with an embodiment of the present technology. As can be seen with reference to FIG. 6, the semiconductor device assembly 600 includes a substrate 601 and three stacks 602-604 of semiconductor dies, with features similar to those discussed in more detail above with reference to FIG. 5. Each of the stacks 602-604 is disposed in a different location on the substrate 601 (e.g., in adjacent, non-overlapping locations). The first stack 602 is a stack of eight of a first type of semiconductor die with a first set of planform dimensions, and the second and third stacks 603 and 604 are stacks of four of a second type of semiconductor die with a second set of planform dimensions, different from the first. By utilizing stacks of semiconductor dies with different sets of planform dimensions, the available space in a device assembly format of a predetermined size can be more efficiently exploited than with a single stack of semiconductor dies or with multiple stacks of semiconductor dies with the same dimensions. In this regard, the first stack 602 has a first area, the second stack 603 has a second area, the third stack 604 has a third area, and a sum of the first, second and third areas can be at least 50%, 67%, 75%, 90%, or even more of an area of the substrate 601.

Figure 7:
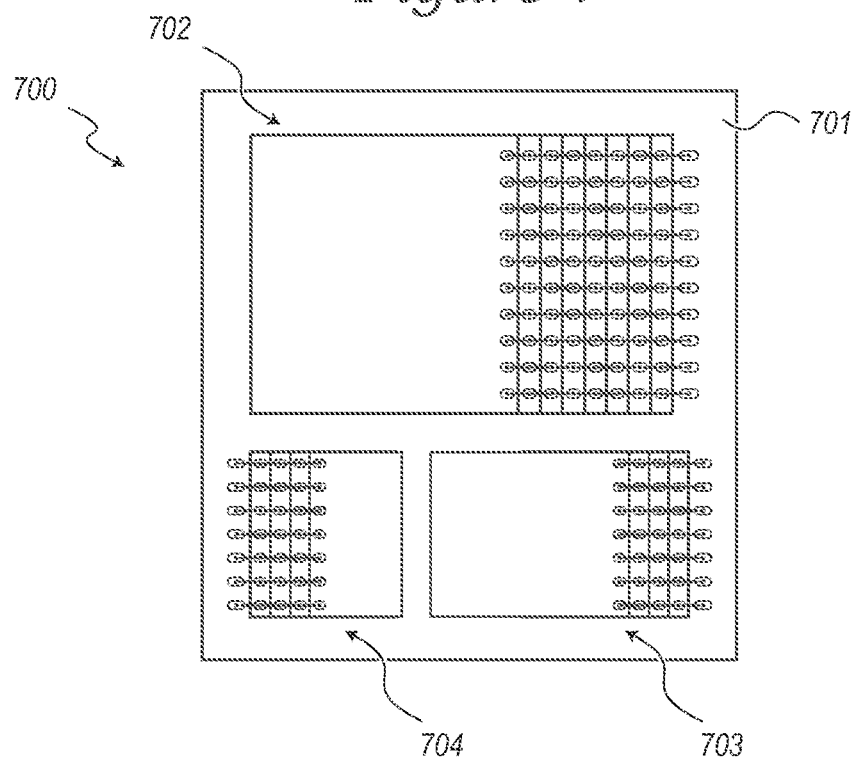
FIG. 7 illustrates a semiconductor device assembly including multiple stacks of different semiconductor dies in accordance with an embodiment of the present technology.

Moreover, although in the foregoing example embodiments, semiconductor device assemblies with two different types of semiconductor dies (e.g., semiconductor dies with two different sets of planform dimensions) have been illustrated, in other embodiments a semiconductor device assembly may have three, four, or even more different types of semiconductor dies. In this regard, FIG. 7 is a simplified plan view of a semiconductor device assembly including three stacks of three different semiconductor dies (e.g., semiconductor dies with three different sets of planform dimensions) in accordance with an embodiment of the present technology. As can be seen with reference to FIG. 7, the semiconductor device assembly 700 includes a substrate 701 and three stacks 702-704 of semiconductor dies, with features similar to those discussed in more detail above with reference to FIGS. 5 and 6. Each of the stacks 702-704 is disposed in a different location on the substrate 701 (e.g., in adjacent, non-overlapping locations). The first stack 702 is a stack of eight of a first type of semiconductor die with a first set of planform dimensions, the second stack 703 is a stack of four of a second type of semiconductor die with a second set of planform dimensions, different from the first, and the third stack 704 is a stack of four of a third type of semiconductor die with a third set of planform dimensions, different from the first and second. By utilizing stacks of semiconductor dies with different sets of planform dimensions, the available space in a device assembly format of a predetermined size can be more efficiently exploited than with a single stack of semiconductor dies or with multiple stacks of semiconductor dies with the same dimensions. In this regard, the first stack 702 has a first area, the second stack 703 has a second area, the third stack 704 has a third area, and a sum of the first, second and third areas can be at least 50%, 67%, 75%, 90%, or even more of an area of the substrate 701.

Although in the foregoing examples, semiconductor device assemblies have been illustrated and described as including shingled stacks of semiconductor dies, in other embodiments of the present technology, semiconductor device assemblies can include multiple stacks of semiconductor dies utilizing different topologies (e.g., vertical stacks, partially shingled stacks, etc.) and interconnection technologies (e.g., TSVs, optical interconnections, inductive interconnections, etc.).

According to one aspect of the subject technology, an advantage of including two or more stacks of different semiconductor dies (e.g., semiconductor dies with different sets of planform dimensions) in a semiconductor device assembly is the additional flexibility provided in layout of the assembly, which can permit efficient use of the available space for a given device assembly format (e.g., providing a greater density of bits for a memory device assembly). In accordance with one aspect of the subject technology, another advantage of providing multiple stacks of different semiconductor dies in a semiconductor device assembly is the reduction in package height that can be achieved (e.g., by using multiple stacks of fewer dies instead of a single, taller stack of dies). Yet another advantage can include the use of thicker semiconductor dies (e.g., which can be more easily manufactured than thinner dies) while maintaining a similar package height as a semiconductor device assembly using a single stack with a greater number of thinner dies.

Figure 8:
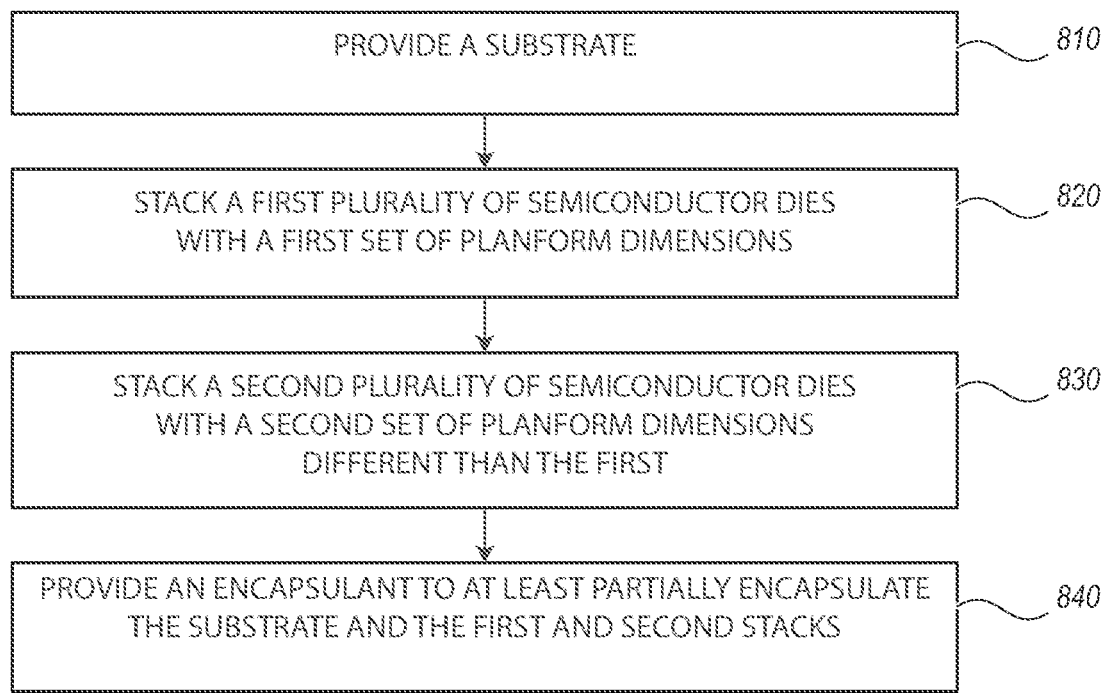
FIG. 8 is a flow chart illustrating a method of making a semiconductor device assembly in accordance with one embodiment of the present technology.

FIG. 8 is a flow chart illustrating a method of making a semiconductor device assembly. The method includes providing a substrate (box 810), stacking a first plurality of semiconductor dies with a first set of planform dimensions on the substrate in a first stack (box 820) and stacking a second plurality of semiconductor dies with a second set of planform dimensions, different from the first set on the substrate in a second stack (box 830). In this regard, the first plurality of semiconductor dies can be stacked directly over a first location on the substrate, and the second plurality of semiconductor dies can be stacked directly over a second location on the substrate. The method can further includes wirebonding or otherwise connecting the first and second pluralities of semiconductor dies to the substrate and providing an encapsulant to at least partially encapsulate the substrate, the first stack and the second stack (box 840).

Figure 9:
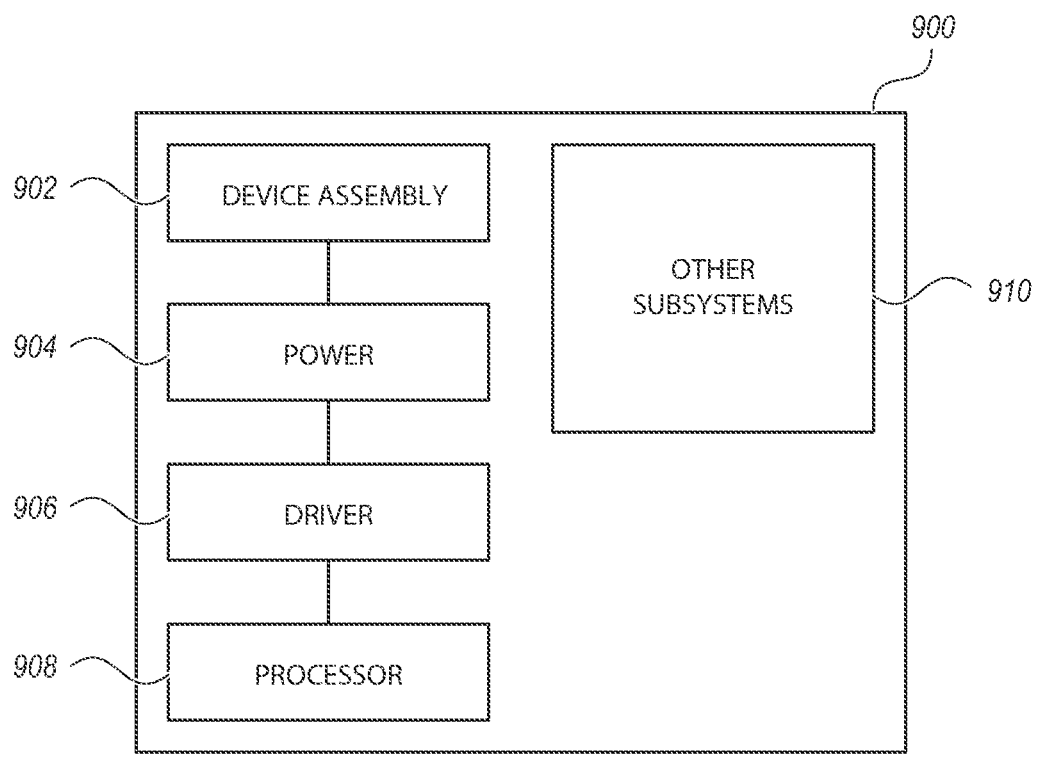
FIG. 9 is a schematic view showing a system that includes a semiconductor device assembly configured in accordance with an embodiment of the present technology.

Any one of the semiconductor device assemblies described above with reference to FIGS. 5-8 can be incorporated into any of a myriad of larger and/or more complex systems, a representative example of which is system 900 shown schematically in FIG. 9. The system 900 can include a semiconductor device assembly 902, a power source 904, a driver 906, a processor 908, and/or other subsystems or components 910. The semiconductor device assembly 902 can include features generally similar to those of the semiconductor devices described above with reference to FIGS. 5-8. The resulting system 900 can perform any of a wide variety of functions, such as memory storage, data processing, and/or other suitable functions. Accordingly, representative systems 900 can include, without limitation, handheld devices (e.g., mobile phones, tablets, digital readers, and digital audio players), computers, vehicles, appliances and other products. Components of the system 900 may be housed in a single unit or distributed over multiple, interconnected units (e.g., through a communications network). The components of the system 900 can also include remote devices and any of a wide variety of computer readable media.

From the foregoing, it will be appreciated that specific embodiments of the invention have been described herein for purposes of illustration, but that various modifications may be made without deviating from the scope of the invention. Accordingly, the invention is not limited except as by the appended claims.

What is claimed is:

1. A semiconductor device assembly, comprising:
   a package substrate having an upper surface with an upper surface area;
   at least one first shingled stack including a plurality of first semiconductor dies, each first semiconductor die of the plurality having a first length and a first width, the at least one first shingled stack overlying a first area of the package substrate;
   at least one second shingled stack including a plurality of second semiconductor dies, each second semiconductor die of the plurality having a second length and a second width, the at least one second shingled stack overlying a second area of the package substrate different from the first area; and
   an encapsulant at least partially encapsulating the package substrate, the at least one first shingled stack and the at least one second shingled stack,
   wherein the first length is different than the second length and the second width.

2. The semiconductor device assembly of claim 1, wherein the first width is different than the second length and the second width.

3. The semiconductor device assembly of claim 1, wherein a sum of the first area and the second area is at least 50% of the upper surface area of the package substrate.

4. The semiconductor device assembly of claim 3, wherein the sum is at least 75% of the upper surface area of the package substrate.

5. The semiconductor device assembly of claim 1, wherein the at least one first shingled stack of semiconductor dies is connected to the package substrate by a first plurality of wirebonds and the second shingled stack of semiconductor dies is connected to the package substrate by a second plurality of wirebonds.

6. The semiconductor device assembly of claim 1, wherein the first semiconductor dies of the at least one first shingled stack are offset from one another in a first direction.

7. The semiconductor device assembly of claim 6, wherein the second semiconductor dies of the at least one second shingled stack are offset from one another in a second direction different from the first direction.

8. The semiconductor device assembly of claim 1, wherein the at least one first shingled stack of semiconductor dies comprises a first plurality of memory dies, and wherein the at least one second shingled stack of semiconductor dies comprises a second plurality of memory dies.

9. The semiconductor device assembly of claim 8, wherein the first plurality of memory dies and the second plurality of memory dies comprise a single memory type.

10. The semiconductor device assembly of claim 8, wherein the first plurality of memory dies and the second plurality of memory dies comprise different memory types.

11. The semiconductor device assembly of claim 8, wherein the first and second pluralities of memory dies each comprise one or more NAND flash, NOR flash, DRAM, PCM, FeRAM, or MRAM memory dies.

12. The semiconductor device assembly of claim 1, wherein the at least one first shingled stack includes two first shingled stacks and wherein the at least one second shingled stack includes two second shingled stacks.

13. The semiconductor device assembly of claim 1, wherein the package substrate includes a plurality of external connectors operably connected to the at least one first and at least one second shingled stacks of semiconductor dies.

14. The semiconductor device assembly of claim 1, further comprising:
at least one third shingled stack including a plurality of third semiconductor dies, each third semiconductor die of the plurality having a third length and a third width, the third shingled stack overlying a third area of the package substrate different from the first area and the second area.

15. A method of making a memory device, comprising:
providing a package substrate having an upper surface with an upper surface area;
stacking a plurality of first semiconductor dies in at least one first shingled stack, each first semiconductor die of the plurality having a first length and a first width, the at least one first shingled stack overlying a first area of the package substrate;
stacking a plurality of second semiconductor dies in at least one second shingled stack, each second semiconductor die of the plurality having a second length and a second width, the at least one second shingled stack overlying a second area of the package substrate different from the first area; and
providing an encapsulant to at least partially encapsulate the package substrate, the at least one first shingled stack and the at least one second shingled stack,
wherein the first length is different than the second length and the second width.

16. The method of claim 15, wherein the first width is different than the third lateral dimension and the fourth lateral dimension.

17. The method of claim 15, wherein a sum of the first area and the second area is at least 50% of the upper surface area of the package substrate.

18. The method of claim 15, wherein the at least one first shingled stack of semiconductor dies comprises a first plurality of memory dies, and wherein the at least one second shingled stack of semiconductor dies comprises a second plurality of memory dies.

19. The method of claim 18, wherein the first plurality of memory dies and the second plurality of memory dies comprise a single memory type.

20. The method of claim 18, wherein the first plurality of memory dies and the second plurality of memory dies comprise different memory types.

* * * * *